(12) United States Patent
Nam

(10) Patent No.: US 7,956,983 B2
(45) Date of Patent: Jun. 7, 2011

(54) EXPOSURE EQUIPMENT HAVING AUXILIARY PHOTO MASK AND EXPOSURE METHOD USING THE SAME

(75) Inventor: Dong-Seok Nam, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 568 days.

(21) Appl. No.: 11/635,045

(22) Filed: Dec. 7, 2006

(65) Prior Publication Data

US 2007/0148561 A1 Jun. 28, 2007

(30) Foreign Application Priority Data

Dec. 23, 2005 (KR) ................ 10-2005-0128892

(51) Int. Cl.
*G03B 27/44* (2006.01)
*G03B 27/42* (2006.01)
*G03B 27/54* (2006.01)
*G03B 27/62* (2006.01)
*G03B 27/32* (2006.01)

(52) U.S. Cl. ................ 355/46; 355/53; 355/67; 355/75; 355/77

(58) Field of Classification Search ............. 355/40, 355/46, 53, 77, 67–71, 75; 430/311, 312, 430/319, 5, 8, 30; 250/492.1, 492.2, 492.22, 250/548

See application file for complete search history.

(56) References Cited

U.S. PATENT DOCUMENTS

| | | | | |
|---|---|---|---|---|
| 3,542,469 A * | 11/1970 | Hennings | ........................ | 355/46 |
| 4,758,863 A * | 7/1988 | Nikkel | ........................... | 355/40 |
| 5,272,744 A * | 12/1993 | Itou et al. | ........................ | 378/35 |
| 5,320,918 A * | 6/1994 | Raab et al. | ........................ | 430/4 |
| 5,329,335 A * | 7/1994 | Wada et al. | ....................... | 355/53 |
| 5,369,464 A * | 11/1994 | Kamon | ........................... | 355/43 |
| 5,418,599 A * | 5/1995 | Kamon | ............................ | 355/77 |
| 5,438,204 A * | 8/1995 | von Bunau et al. | ......... | 250/492.2 |
| 5,461,455 A * | 10/1995 | Coteus et al. | .................. | 355/43 |
| 5,667,941 A * | 9/1997 | Okamoto et al. | ............. | 430/313 |
| 5,863,677 A * | 1/1999 | Nakao | ............................... | 430/5 |
| 6,077,633 A * | 6/2000 | Lin et al. | ........................... | 430/5 |
| 6,498,351 B1* | 12/2002 | Kruizinga et al. | ......... | 250/492.2 |
| 6,611,316 B2* | 8/2003 | Sewell | ............................ | 355/46 |
| 6,704,092 B2 | 3/2004 | Shiraishi | | |
| 6,795,168 B2* | 9/2004 | Wang et al. | ..................... | 355/67 |
| 6,902,852 B2* | 6/2005 | Watanabe | ......................... | 430/5 |
| 2001/0026355 A1* | 10/2001 | Aoki et al. | ..................... | 355/30 |
| 2002/0150824 A1* | 10/2002 | Park | ................................. | 430/5 |
| 2003/0016339 A1* | 1/2003 | Taniguchi | ....................... | 355/69 |
| 2003/0147058 A1* | 8/2003 | Murakami et al. | ............. | 355/53 |
| 2003/0162104 A1* | 8/2003 | Shoki | ................................. | 430/5 |
| 2003/0165654 A1* | 9/2003 | Yu | ................................. | 428/64.1 |
| 2007/0273854 A1* | 11/2007 | Nagasaka | ....................... | 355/46 |

FOREIGN PATENT DOCUMENTS

| | | | |
|---|---|---|---|
| JP | 59117121 A * | 7/1984 | |
| JP | 2004-172316 | 6/2004 | |
| KR | 1020020058592 A | 7/2002 | |
| KR | 1020040040683 A | 5/2004 | |

* cited by examiner

*Primary Examiner* — Peter B Kim
*Assistant Examiner* — Christina Riddle
(74) *Attorney, Agent, or Firm* — Harness, Dickey & Pierce, P.L.C.

(57) ABSTRACT

Example embodiments of the present invention may provide exposure equipment having an auxiliary photo mask. The exposure equipment may include a light source and a first photo mask spaced apart from the light source by a desired distance. A second photo mask may include a third region and a fourth region. An exposure method using the exposure equipment also may be provided.

19 Claims, 6 Drawing Sheets

EXPOSURE EQUIPMENT HAVING AUXILIARY PHOTO MASK AND EXPOSURE METHOD USING THE SAME

A claim of priority is made under 35 U.S.C. §119 to Korean Patent Application 2005-128892 filed on Dec. 23, 2005, the entire contents of which are hereby incorporated by reference.

BACKGROUND OF THE INVENTION

1. Field of the Invention

Example embodiments of the present invention relate to exposure equipment and an exposure method using the same, and more particularly, to exposure equipment having an auxiliary photo mask and an exposure method using the same.

2. Description of Related Art

A semiconductor device may be manufactured using various unit processes, for example, a photolithography process, an etching process, a thin film deposition process, a diffusion process, and so on. Among the manufacturing processes, the photolithography process directly affects formation of fine patterns on a semiconductor device. Therefore, the photolithography process plays a vital role in the manufacturing of highly integrated semiconductor devices.

The photolithography process may include a coating step of forming a photoresist layer on a semiconductor substrate; an exposure step of selectively irradiating light on a predetermined region of the photoresist layer using a photo mask; and a development step of selectively removing the exposed photoresist layer to form a photoresist pattern.

The exposure step may include aligning the semiconductor substrate having a photoresist layer to a photo mask, irradiating light from a light source to the photo mask, and transferring a shape of the exposure patterns on the photo mask to the photoresist layer. The exposure patterns may be formed of opaque patterns or reflective patterns.

FIG. 1 is a schematic diagram of exposure equipment having a conventional transmissive photo mask.

Referring to FIG. 1, the exposure equipment may include a light source 10, and a transmissive photo mask 12 spaced apart from the light source 10. The transmissive photo mask 12 may have various shaped exposure patterns. The exposure patterns may be formed of opaque patterns 14. The exposure patterns may be divided into a high-density opaque pattern region 16a and a low-density opaque pattern region 16b according to a variation of a critical dimension (CD) corresponding to an interval between the opaque patterns 14. In other words, if the opaque patterns 14 have the same width, the interval between the opaque patterns 14 disposed in the high-density opaque pattern region 16a may be smaller than that between the opaque patterns disposed in the low-density opaque pattern region 16b.

A masking blade 18 may be disposed between the light source 10 and the transmissive photo mask 12. The masking blade 18 may function to define an irradiation region of light on the transmissive photo mask 12.

A wafer stage 20 may be disposed at a position spaced apart from the transmissive photo mask 12. A wafer chuck 22 may be disposed on the wafer stage 20. The wafer chuck 22 may function to support a wafer 24. An optical system 26 may be disposed between the wafer chuck 22 and the transmissive photo mask 12. The optical system 26 may function to project light passing through the transmissive photo mask 12 onto the wafer chuck 22. The light passing through the optical system 26 may also pass through a light transmission adjustment mask 28 prior to entering the wafer chuck 22. The light transmission adjustment mask 28 may function to adjust an amount of light on the wafer chuck 22. The light on the wafer chuck 22 may be irradiated to a photoresist layer on the wafer 24 to form photoresist patterns thereon.

Transmissivity of the light passing through the transmissive photo mask 12 varies depending on a variation of the critical dimension of the exposure patterns. As a result, although the exposure patterns on the transmissive photo mask 12 may have the same width, the photoresist patterns formed on the wafer 24 may have different widths due to interference of the light generated while passing through the transmissive photo mask 12. For example, the photoresist patterns formed by the light passing through the high-density opaque pattern region 16a may be lower in resolution or contrast than the photoresist patterns formed by the light passing through the low-density opaque pattern region 16b. Consequently, the variation of the critical dimension of the exposure patterns may deteriorate the uniformity of the photoresist patterns formed on the wafer 24. In addition, the variation in the critical dimension of the exposure patterns may be created due to manufacturing tolerance of the exposure patterns.

The light transmission adjustment mask 28 may only adjust light intensity of the exposure equipment, regardless of the amount of the light passing through the high-density opaque pattern region 16a and the low-density opaque pattern region 16b, and thus, the adjustment mask 28 does not aid in solving the problems described above.

One conventional exposure apparatus includes a diffraction grating pattern plate in a conjugate relation with a reticle. However, when the grating pattern plate is used as a light transmission adjustment mask during an exposure process, a grating pattern on the grating pattern plate may be transferred onto a wafer.

FIG. 2 is a schematic diagram of exposure equipment having a conventional reflective photo mask.

The exposure equipment having the reflective photo mask may generally use extreme ultraviolet (EUV) as a light source. The EUV may be used as a light source, because short wavelength of the EUV is well absorbed, and therefore may be difficult to use in transmissive mask equipment.

Referring to FIG. 2, light may be irradiated to a reflective photo mask 32 from a light source 30 having a short wavelength, for example, EUV. The light reflected from the reflective photo mask 32 may be reflected by a plurality of mirrors M1, M2, M3 and M4, and then irradiated to a photoresist layer on a wafer 34. As a result, photoresist patterns may be formed on the wafer 34.

Exposure patterns may be formed on the reflective photo mask 32. The exposure patterns may be formed of a plurality of light absorbing layer patterns 36. The exposure patterns may be formed of a high-density light absorbing layer pattern region 38a and a low-density light absorbing layer pattern 38b. In example embodiments, according to a variation of a critical dimension of the exposure patterns, reflectivity of light reflected from the reflective photo mask 32 may vary. As a result, although the exposure patterns on the reflective photo mask 32 have the same width, the photoresist patterns formed on the wafer may have different widths due to dispersion of light generated while the light is reflected from the reflective photo mask 32. For example, because the light reflected from the low-density light absorbing layer pattern region 38b is larger in dispersion than the light reflected from the high-density light absorbing layer pattern region 38a, basic light intensity reflected from the reflective photo mask 32 may become different according to the density of the exposure patterns.

A difference in the basic intensity may be generated due to a variation of the critical dimension caused by manufacturing tolerance of the exposure patterns.

Consequently, the variation of the critical dimension of the exposure patterns may degrade uniformity of the photoresist patterns formed on the wafer 34.

SUMMARY OF THE INVENTION

Example embodiments of the present invention provide exposure equipment having an auxiliary photo mask.

Example embodiments of the present invention provide exposure equipment having an auxiliary photo mask appropriate to improve uniformity of reflectivity of light in an exposure process of a semiconductor device.

Example embodiments of the present invention provide an exposure method appropriate to improve productivity of an exposure process of a semiconductor device.

According to example embodiments of the present invention, there is provided exposure equipment having an auxiliary photo mask appropriate to improve uniformity of light transmissivity in an exposure process of a semiconductor device. The exposure equipment may include a light source, and a main photo mask spaced apart from the light source by a predetermined distance. An auxiliary photo mask having transparent regions and translucent regions may be disposed in conjugation with the main photo mask.

In some example embodiments of the present invention, the auxiliary photo mask may be disposed between the light source and the main photo mask.

In some example embodiments, the main photo mask may include a high-density opaque layer pattern region and a low-density opaque layer pattern region, wherein the transparent regions of the auxiliary photo mask are disposed corresponding to the high-density opaque layer pattern region and the translucent regions of the auxiliary photo mask are disposed corresponding to the low-density opaque layer pattern region.

In some example embodiments, the translucent region of the auxiliary photo mask may include a phase shift layer.

In some example embodiments, the translucent region of the auxiliary photo mask may include a crystal defect layer.

In some example embodiments, the exposure equipment may further include a condenser lens disposed between the auxiliary photo mask and the main photo mask.

According to example embodiments of the present invention, there is provided exposure equipment having an auxiliary photo mask appropriate to improve uniformity of light transmissivity in an exposure process of a semiconductor device. The exposure equipment may include a light source, and a main photo mask spaced apart from the light source by a predetermined distance. An auxiliary photo mask is in a conjugate relation with the main photo mask, and has a first reflective layer, and a transparent layer and a translucent layer, which are formed on the first reflective layer.

In some example embodiments of the present invention, the main photo mask may include a second reflective layer, and a high-density light absorbing layer pattern region and a low-density light absorbing layer pattern region disposed on the second reflective layer, wherein the transparent layer of the auxiliary photo mask is disposed corresponding to the high-density light absorbing layer pattern region, and the translucent layer of the auxiliary photo mask is disposed corresponding to the low-density light absorbing layer pattern region.

In some example embodiments, the auxiliary photo mask may be disposed between the light source and the main photo mask.

In some example embodiments, the exposure equipment may further include a reflective mirror disposed between the auxiliary photo mask and the main photo mask, wherein light reflected from the auxiliary photo mask enters the reflective layer, and the light reflected from the reflective mirror enters the main photo mask.

In some example embodiments, the translucent layer of the auxiliary photo mask may include a phase shift layer.

In some example embodiments, the translucent region of the auxiliary photo mask may include a crystal defect layer.

According to example embodiments of the present invention, there is provided an exposure method appropriate to improve productivity of an exposure process in a semiconductor device. The exposure method may include irradiating light from a light source. The light irradiated from the light source enters an auxiliary photo mask having a transparent layer and a translucent layer. The light entering the auxiliary photo mask enters from the auxiliary photo mask to the main photo mask, wherein the auxiliary photo mask is in a conjugate relation with the main photo mask.

In some example embodiments of the present invention, the exposure method may further include loading a wafer such that the auxiliary photo mask or the main photo mask is in a conjugate relation with the wafer.

In some example embodiments, the light entering the auxiliary photo mask may enter a high-density opaque layer pattern region of the main photo mask through the transparent layer of the auxiliary photo mask. Similarly, the light entering the auxiliary photo mask may enter a low-density opaque layer pattern region of the main photo mask through the translucent layer of the auxiliary photo mask.

In some example embodiments, the exposure method may further include passing the light through a condenser lens, before the light passing through the auxiliary photo mask enters the main photo mask.

In some example embodiments, the light entering the auxiliary photo mask may enter a first reflective layer of the auxiliary photo mask through the transparent layer and the translucent layer of the auxiliary photo mask. The light entering the first reflective layer through the transparent layer may form a first light to be reflected from the first reflective layer. The light entering the first reflective layer through the translucent layer may form a second light to be reflected from the first reflective layer.

In some example embodiments, the first light may enter a second reflective layer of the main photo mask through a high-density light absorbing layer pattern of the main photo mask. The second light may enter the second reflective layer of the main photo mask through a low-density light absorbing layer pattern of the main photo mask.

In some example embodiments, the exposure method may further include entering the light into a reflective mirror, before the first light and the second light enter the second reflective layer of the main photo mask.

In some example embodiments, the translucent layer of the auxiliary photo mask may be formed of a phase shaft layer.

In some example embodiments, the translucent layer of the auxiliary photo mask may be formed of a crystal defect layer.

BRIEF DESCRIPTION OF THE DRAWINGS

The foregoing and other aspects of the present invention will be apparent from the more detail description of example embodiments of the present invention, and as illustrated in the accompanying drawing. The drawing is not necessarily to scale, emphasis instead being placed upon illustrating the aspects of example embodiments of the present invention.

DETAILED DESCRIPTION OF EXAMPLE EMBODIMENTS OF THE PRESENT INVENTION

Figure 1:
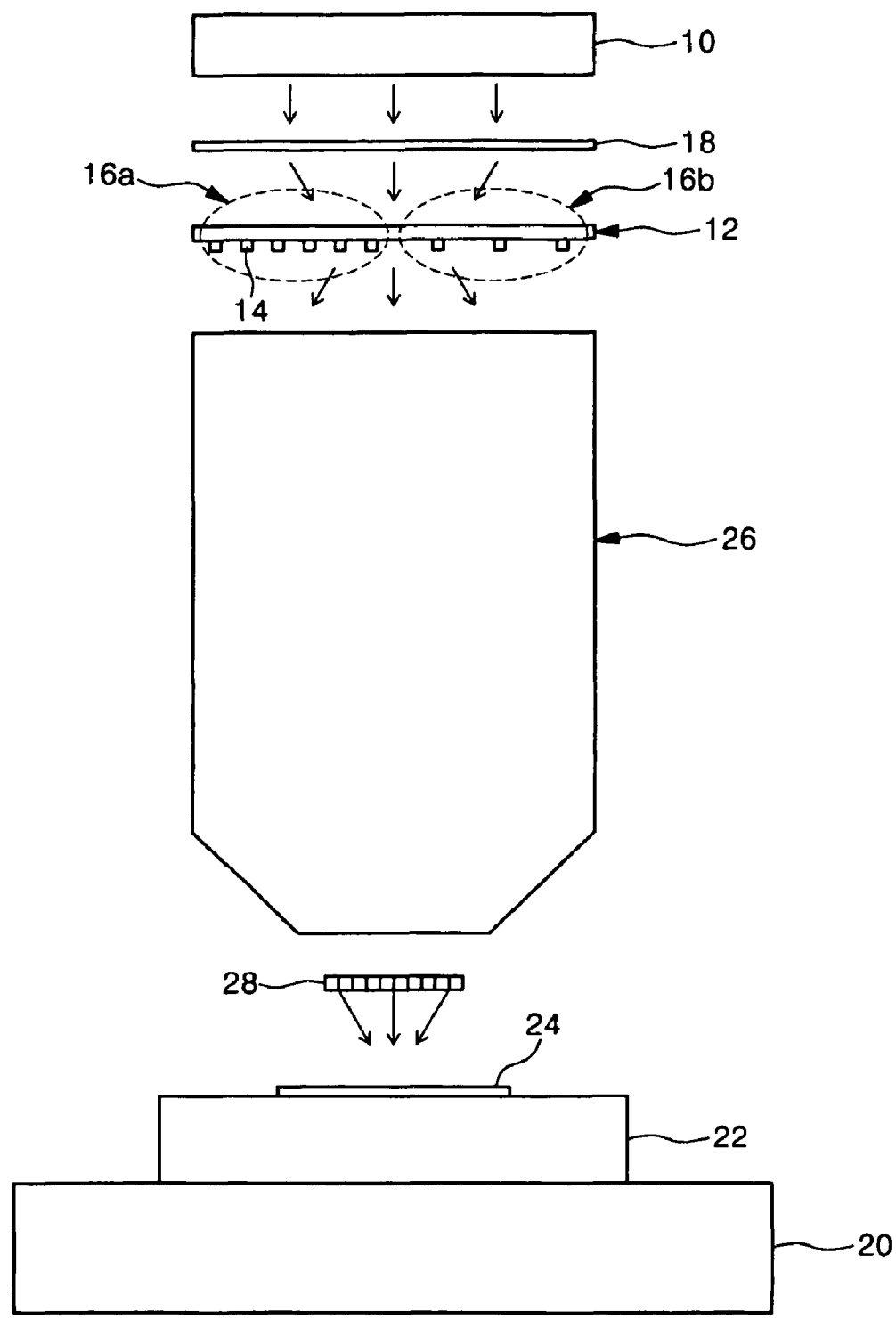
FIG. 1 is a schematic diagram of exposure equipment having a conventional transmissive photo mask.
Figure 2:
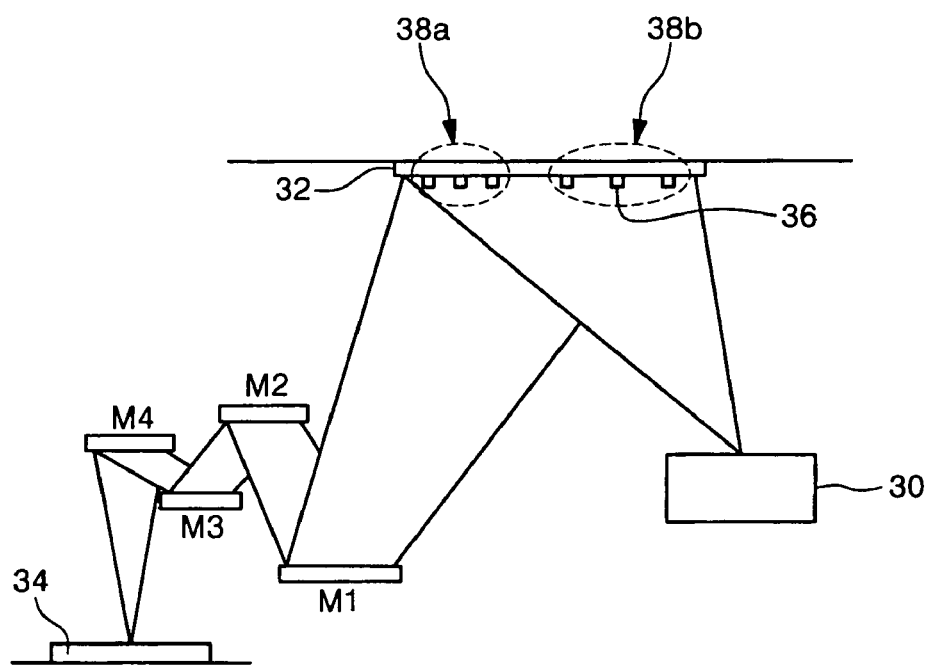
FIG. 2 is a schematic diagram of exposure equipment having a conventional reflective photo mask.

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification. It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
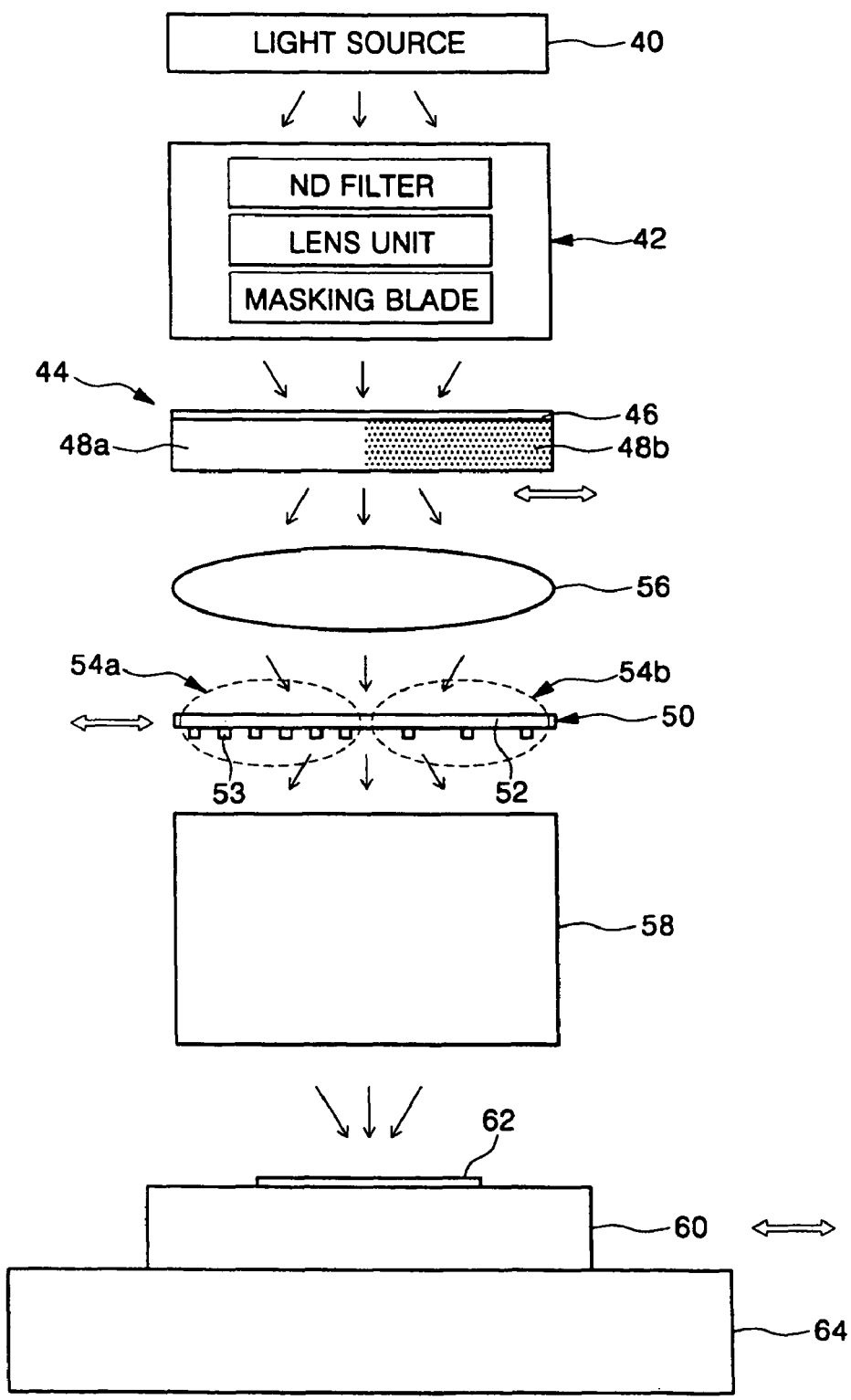
FIG. 3 is a schematic diagram of exposure equipment in accordance with an example embodiment of the present invention.

Referring to FIG. 3, exposure equipment in accordance with an example embodiment of the present invention may include a light source 40, and an illumination optical system 42 spaced apart from the light source 40 by a desired distance. The light source 40 may irradiate light to the illumination optical system 42. The light source 40 may use a KrF excimer laser having a wavelength of 248 nm, or an ArF excimer laser having a wavelength of 193 nm. The illumination optical system 42 may include a neutral density (ND) filter, a lens unit, a masking blade, and so on. The ND filter may function to reduce an amount of light entering from the light source 40 and to adjust light intensity to thereby reduce and/or suppress light diffraction. The lens unit may be a lens array including an input lens, a condenser lens, a fly eye lens, and so on. The condenser lens may function to collect light entering the lens unit to form parallel light. The fly eye lens may function to uniformly illuminate the light entering the lens unit. The masking blade may function to define an irradiation region of light passing through the illumination optical system 42. In addition, the illumination optical system 42 may include a mirror unit (not shown).

The light passing through the illumination optical system 42 may enter an auxiliary photo mask 44 spaced apart from the illumination optical system 42 by a desired distance. The auxiliary photo mask 44 and the light source 40 may be in a conjugate relation with each other. The auxiliary photo mask 44 may be movably disposed. The auxiliary photo mask 44 may include a transparent substrate 46, a transparent region 48a, and a translucent region 48b disposed on the transparent substrate 46. The term region may mean an area on a layer or the layer itself. The transparent region 48a and the translucent region 48b may be disposed adjacent to each other. The transparent substrate 46 may be formed of transparent quartz. The light entering the auxiliary photo mask 44 may pass through the transparent region 48a and the translucent region 48b. The transparent region 48a may be formed of transparent quartz. The translucent region 48b may be formed of translucent molybdenum silicide (MoSi). Therefore, because the transparent region 48a and the translucent region 48b have different light transmissivities, intensities of light passing through the transparent region 48a and the translucent region 48b may be different from each other. For example, the intensity of light passing through the transparent region 48a may be greater than that of light passing through the translucent region 48b. Accordingly, the translucent region 48b may function as a phase shift region. Therefore, it may be possible to adjust transmissivity of light passing through the translucent region 48b. As a result, the translucent region 48b may function as a region for adjusting light transmissivity. The translucent region 48b may be formed of a molybdenum silicide material having chrome patterns disposed thereon. In example embodiments, the chrome patterns may function as an opaque region. The translucent region 48b may be generally designed to have a light transmissivity of about 8% and a phase shift of 180°, but not limited thereto. For example, by varying the thickness of the molybdenum silicide and an interval between the chrome patterns to design the translucent region 48b, it may be possible to adjust light transmissivity and phase variation of the light passing through the translucent region 48b.

In addition, the translucent region 48b may be crystal defect. For example, the crystal defect may be provided in a quartz substrate using a laser. Therefore, the light entering the quartz substrate having the crystal defect may be scattered by the crystal defect, thereby adjusting the light transmissivity. In addition, a crystal defect may also be provided in molybdenum silicide. Alternatively, impurities may be doped in the quartz substrate of the translucent region 48b. Alternatively, the translucent region 48b may be formed by depositing chrome on the quartz substrate.

The auxiliary photo mask 44 may include a transparent region 48a and a translucent region 48b only, but not limited to the plurality of region. For example, the translucent region 48b may be formed of a plurality of sequentially aligned region having different transparencies.

A main photo mask 50 may be disposed at a position spaced apart from the auxiliary photo mask 44 by a desired distance. In example embodiments, the auxiliary photo mask 44 may be in a conjugate relation with the main photo mask 50. As a result, optical images at the auxiliary photo mask 44 and the main photo mask 50 may be identical to each other. The auxiliary photo mask 44 and the main photo mask 50 may be in a conjugate relation with each other at various positions. Therefore, auxiliary photo masks 44 may be disposed at various positions that are in a conjugate relation with the main photo mask 50. For example, as described above, the auxiliary photo mask 44 may be disposed between the light source 40 and the main photo mask 50, or the main photo mask 50 may be disposed between the light source 40 and the auxiliary photo mask 44.

The auxiliary photo mask 44 or the main photo mask 50 may be movably aligned such that the auxiliary photo mask 44 and the main photo mask 50 are in a conjugate relation.

In addition, in the case of a scan type exposure equipment, in order to improve a synchronization margin for aligning the auxiliary photo mask 44 and the main photo mask 50, the auxiliary photo mask 44 may be manufactured or disposed to be larger in size as compared with the main photo mask 50.

Alternatively, the auxiliary photo mask 44 may be disposed in contact with the main photo mask 50.

The main photo mask 50 may include an exposure pattern. For example, the main photo mask 50 may include a transparent substrate 52, a high-density opaque pattern region 54a, and a low-density opaque pattern region 54b disposed on the transparent substrate 52 adjacent to each other. The transparent substrate 52 may be formed of transparent quartz. Exposure patterns 53, for example, chrome patterns, formed on the transparent substrate 52 may be disposed in the high and low-density opaque pattern regions 54a and 54b. When the chrome patterns have the same width, the chrome patterns in the high-density opaque pattern region 54a are relatively short in interval than the chrome patterns in the low-density opaque pattern region 54b. In other words, a critical dimension (CD) of the exposure pattern may not be uniform. Therefore, when the light enters the main photo mask 50, transmissivity of the light passing through the high-density opaque pattern region 54a may be relatively smaller than that of the light passing through the low-density opaque pattern region 54b.

When the main photo mask 50 includes the high and low-density opaque pattern regions 54a and 54b, the transparent region 48a of the auxiliary photo mask 44 may be disposed corresponding to the high-density opaque pattern region 54a of the main photo mask 50, and the translucent region 48b of the auxiliary photo mask 44 may be disposed corresponding to the low-density opaque pattern region 54b of the main photo mask 50. Therefore, the light passing through the transparent region 48a of the auxiliary photo mask 44 may enter the high-density opaque pattern region 54a of the main photo mask 50. Similarly, the light passing through the translucent region 48b of the auxiliary photo mask 44 may enter the low-density opaque pattern region 54b of the main photo mask 50. As a result, transmission amount of the light passing through the auxiliary photo mask 44 and through the main photo mask 50 may be uniform. In other words, light transmissivity of the exposure process may be adjusted by using the auxiliary photo mask 44 in accordance with an example embodiment of the present invention.

Alternatively, the high and low-density opaque pattern regions may be classified according to uniformity of the line width of a chrome pattern formed on the main photo mask 50.

The auxiliary photo mask 44 and the main photo mask 50 may be movably disposed. Therefore, in order to optimize uniformity of transmission amount of the light passing through the main photo mask 50, the auxiliary photo mask 44 or the main photo mask 50 may be moved accordingly.

A condenser lens 56 may be disposed between the auxiliary photo mask 44 and the main photo mask 50. The condenser lens 56 may function to collect light passing through the auxiliary photo mask 44 to form parallel light. In example embodiments, the condenser lens 56 may be used such that the auxiliary photo mask 44 is in a conjugate relation with the main photo mask 50. In addition, the auxiliary photo mask 44, the main photo mask 50, and the condenser lens 56 may be disposed to have a conjugate relation. As a result, the light passing through the condenser lens 56 may enter the main photo mask 50.

In addition, various optical devices, for example, reflective mirrors or optical filters may be disposed between the auxiliary photo mask 44 and the main photo mask 50.

A projection optical system 58 may be spaced apart from the main photo mask 50 by a desired distance. The projection optical system 58 may be a reduction projection optical system. The projection optical system 58 may include a lens array.

A wafer chuck 60 may be spaced apart from the projection optical system 58 by a desired distance. A wafer 62 may be disposed on the wafer chuck 60. The wafer 62 may be in a conjugate relation with the main photo mask 50. As a result, the auxiliary photo mask 44, the main photo mask 50, and the wafer 62 may be in a conjugate relation with each other. The wafer chuck 60 may be disposed on a wafer stage 64. The wafer stage 64 may be movably disposed. Therefore, the wafer 62 may be loaded such that the main photo mask 50 is in a conjugate relation with the wafer 62 by moving the wafer stage 64.

While the auxiliary photo mask 44 may be disposed corresponding to the density of the opaque patterns of the main photo mask 50, the auxiliary photo mask 44 may be disposed corresponding to manufacturing tolerance of exposure patterns of the main photo mask 50. For example, a translucent region of an auxiliary photo mask 44 may be disposed corresponding to exposure patterns of the main photo mask 50 having a certain manufacturing tolerance.

As described above, the auxiliary photo mask 44 of the exposure equipment in accordance with example embodiments of the present invention may be variously disposed such that the auxiliary photo mask 44 may be in a conjugate relation with the main photo mask 50. For example, the auxiliary photo mask 44 may be disposed between the main photo mask 50 and the projection optical system 58 to have a conjugate relation with the main photo mask 50.

Figure 4:
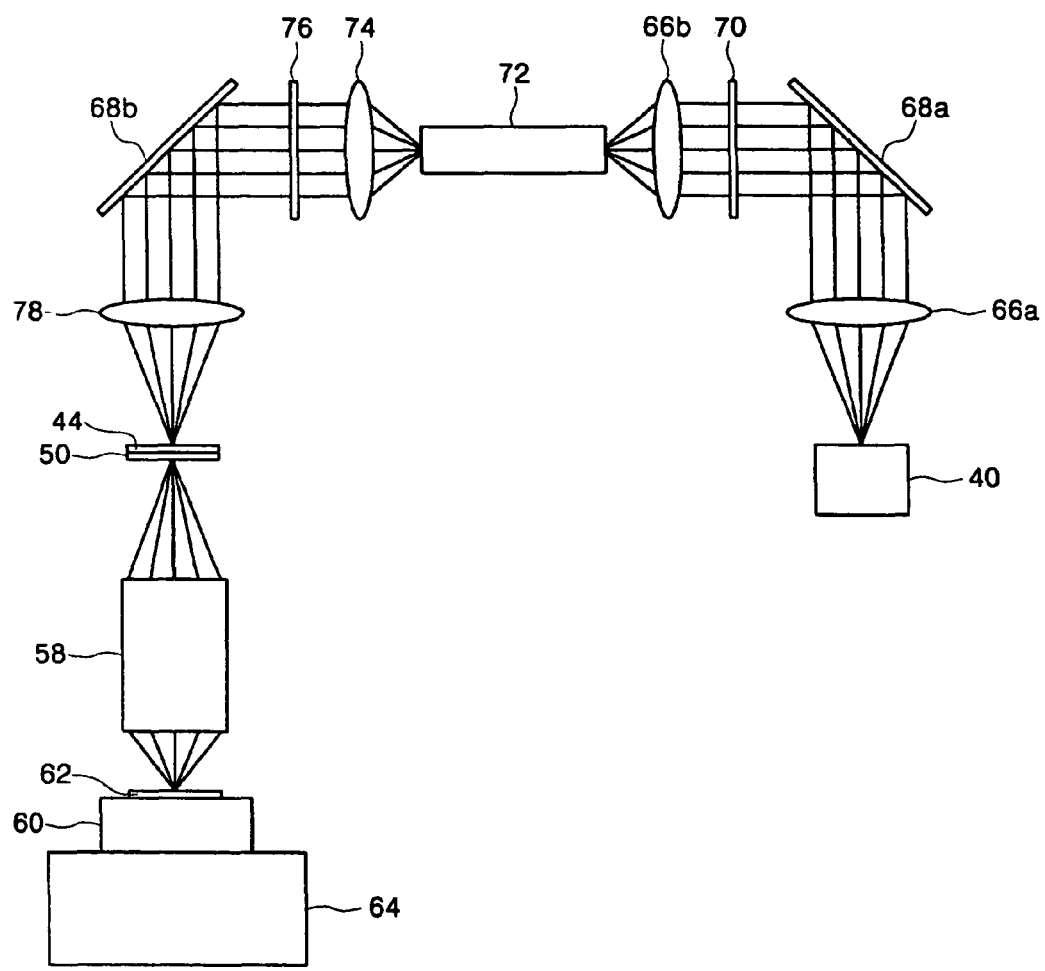
FIG. 4 is a schematic diagram of exposure equipment in accordance with another example embodiment of the present invention.
Figure 5:
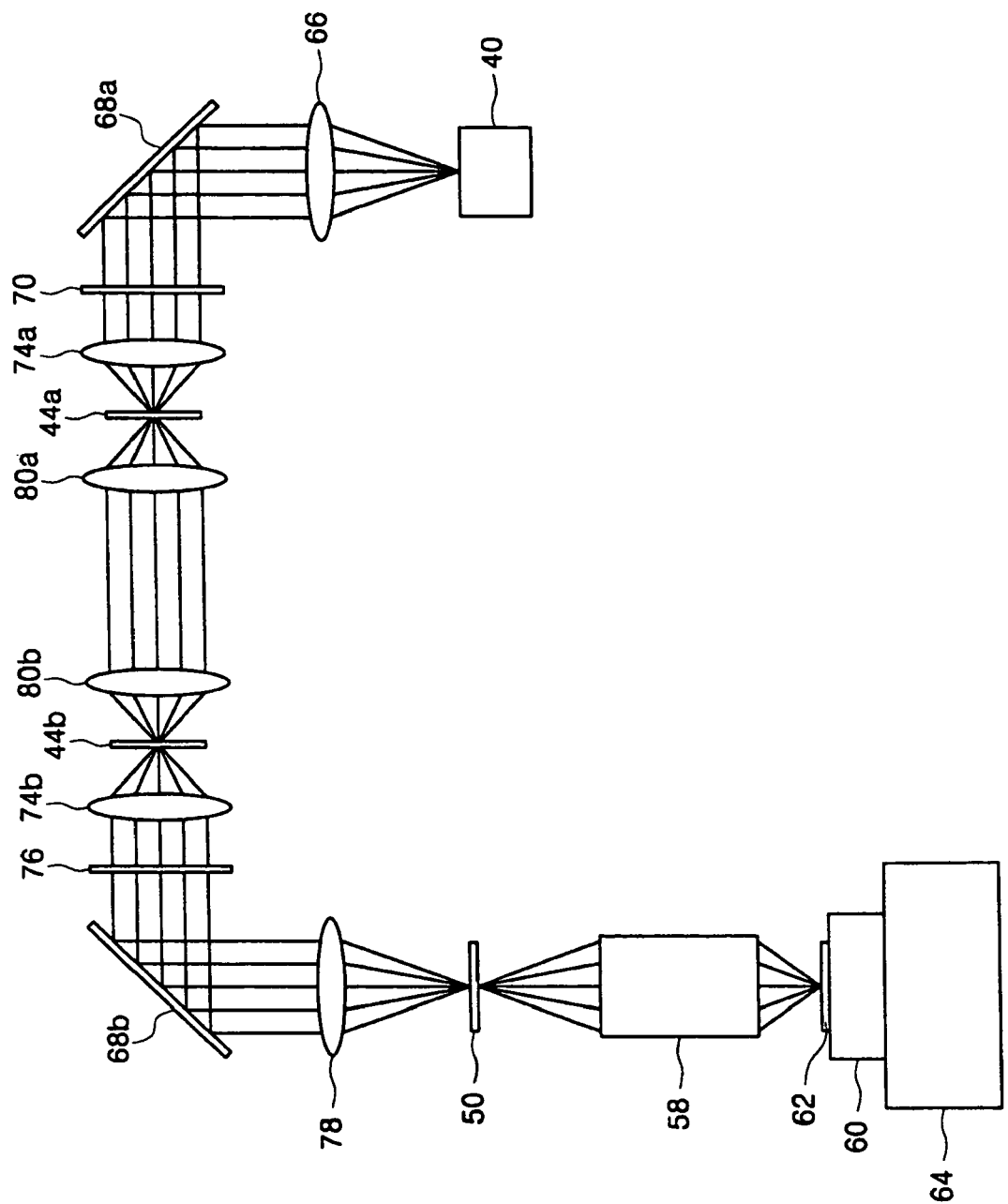
FIG. 5 is a schematic diagram of exposure equipment in accordance with still another example embodiment of the present invention.

FIGS. 4 and 5 illustrate arrangement examples of auxiliary photo mask exposure equipment in accordance with example embodiments of the present invention.

Referring to FIG. 4, the exposure equipment in accordance with example embodiments of the present invention may include a light source 40, and first and second input lenses 66a and 66b sequentially spaced apart from the light source 40 by desired distances. In addition, a first reflective mirror 68a and an ND filter 70 may be sequentially disposed between the first and second input lenses 66a and 66b. Therefore, light irradiated from the light source 40 may enter the first reflective mirror 68a through the first input lens 66a. The light entering the first reflective mirror 68a may be reflected from the first reflective mirror 68a to enter the second input lens 66b through the ND filter 70.

A quartz rod 72 may be spaced apart from the second input lens 66b by a desired distance. The quartz rod 72 may have an extended bar shape, and may function to uniformly distribute light intensity. After the light entering the second input lens 66b passes through the second input lens 66b, the light may enter the quartz rod 72.

A condenser lens 74 may be spaced apart from the quartz rod 72 by a desired distance on the opposite side of the second input lens 66b. Therefore, the light passing through the quartz rod 72 may enter the condenser lens 74. The condenser lens 74 may function to collect light to form parallel light.

A masking blade 76, a second reflective mirror 68b, and a collimator lens 78 may be sequentially disposed and spaced apart from the condenser lens 74 by desired distances. Therefore, the light entering the condenser lens 74 may pass through the condenser lens 74, and then may enter the masking blade 76. After passing through the masking blade 76, the light may be reflected from the second reflective mirror 68b. The light reflected from the second reflective mirror 68b may pass through the collimator lens 78.

An auxiliary photo mask 44 and a main photo mask 50 may be spaced apart from the collimator lens 78 by desired distances. The auxiliary photo mask 44 and the main photo mask 50 may be in contact with each other. While the auxiliary photo mask 44 and the main photo mask 50 may be sequentially disposed in a direction of light, their respective position may be switched.

Specific elements of the auxiliary photo mask 44 and the main photo mask 50 may be similar to the elements disclosed with reference to FIG. 3. Therefore, a description of those specific elements and their arrangement within the auxiliary photo mask 44 and the main photo mask 50 will be omitted.

The light passing through the collimator lens 78 may pass through the auxiliary photo mask 44 and the main photo mask 50 in a sequential manner.

A projection optical system 58 may be spaced apart from the main photo mask 50 by a desired distance. Therefore, the light passing through the main photo mask 50 may enter and then pass through the projection optical system 58.

A wafer chuck 60 may be spaced apart from the projection optical system 58 by a desired distance. A wafer 62 may be disposed on the wafer chuck 60. The auxiliary photo mask 44 or the main photo mask 50 may be in a conjugate relation with the wafer 62. The wafer chuck 60 may be disposed on a wafer stage 64. Therefore, the light passing through the projection optical system 58 may be irradiated to a photoresist layer disposed on the wafer 62 to form a photoresist pattern.

Hereinafter, exposure equipment in accordance with another example embodiment of the present invention will be described.

Referring to FIG. 5, exposure equipment in accordance with example embodiments of the present invention may include a light source 40, and an input lens 66 spaced apart from the light source 40. Therefore, light irradiated from the light source 40 may enter and then pass through the input lens 66. A first reflective mirror 68a, an ND filter 70, and a first condenser lens 74a may be sequentially disposed and spaced apart from the input lens 66 by desired distances. Therefore, the light passing through the input lens 66 may enter the first reflective lens 68a. The light entering the first reflective mirror 68a may be reflected from the first reflective mirror 68a. The light reflected from the first reflective mirror 68a may enter and then pass through the ND filter 70.

A first condenser lens 74a may be spaced apart from the ND filter 70 by a desired distance. Therefore, the light passing through the ND filter 70 may enter and then pass through the first condenser lens 74a.

A first auxiliary photo mask 44a may be spaced apart from the first condenser lens 74a by a desired distance. Specific elements of the first auxiliary photo mask 44a may be similar to those of the auxiliary photo mask 44 described with respect to FIGS. 3 and 4, and thus, a description of the specific elements and functions of the first auxiliary photo mask 44a will not be repeated. The light passing through the first condenser lens 74a may enter and then pass through the first auxiliary photo mask 44a.

A first optical lens 80a may be spaced apart from the first auxiliary photo mask 44a by a desired distance. Therefore, the light passing through the first auxiliary photo mask 44a may enter and then pass through the first optical lens 80a. The first optical lens 80a may collect the light passing through the first auxiliary photo mask 44a to form parallel light.

A second optical lens 80b may be spaced apart from the first optical lens 80a by a desired distance. In addition, a second auxiliary photo mask 44b may be spaced apart from the second optical lens 80b by a desired distance. The first and second auxiliary photo masks 44a and 44b may be in a conjugate relation with each other. The light passing through the first optical lens 80a may enter and then pass through the second optical lens 80b. Subsequently, the light passing through the second optical lens 80b may enter and then pass through the second auxiliary photo mask 44b. In example embodiments, the second optical lens 80b may collect light passing through the first optical lens 80a to focus the light to the second auxiliary photo mask 44b. Specific elements of the second auxiliary photo mask 44b may be similar to those of the auxiliary photo mask as described with respect to FIGS. 3 and 4, and thus, a description of the specific elements and functions of the second auxiliary photo mask 44b will also be omitted.

A second condenser lens 74b may be spaced apart from the second auxiliary photo mask 44b by a desired distance. In addition, a masking blade 76, a second reflective mirror 68b, and a collimator lens 78 may be sequentially spaced apart from the second condenser lens 74b by desired distances. Therefore, the light passing through the second auxiliary photo mask 44b may sequentially pass through the second condenser lens 74b and the masking blade 76. Subsequently, the light passing through the masking blade 76 may be reflected from the second reflective mirror 68b and then pass through the collimator lens 78.

A main photo mask 50 may be spaced apart from the collimator lens 78 by a desired distance. Therefore, the light passing through the collimator lens 78 may enter and then pass through the main photo mask 50. In example embodiments, the main photo mask 50 may be in a conjugate relation with the first and second auxiliary photo masks 44a and 44b. Specific elements and functions of the main photo mask 50 may be similar to those disclosed with reference to FIGS. 3 and 4, and thus, a description thereof will be omitted.

A third auxiliary photo mask (not shown) in a conjugate relation with the main photo mask 50 may be disposed between the light source 40 and the input lens 66.

A projection optical system 58 may be spaced apart from the main photo mask 50 by a desired distance. In addition, a wafer chuck 60 may be spaced apart from the projection optical system 58 by a desired distance. A wafer 62 may be disposed on the wafer chuck 60. In example embodiments, the first and second auxiliary photo masks 44a and 44b or the main photo mask 50 and the wafer 62 may be in a conjugate relation with each other. The wafer chuck 60 may be disposed on a wafer stage 64. Therefore, the light passing through the main photo mask 50 may enter and then pass through the projection optical system 58. The light passing through the projection optical system 58 may be irradiated onto a photoresist layer formed on the wafer 62 to form a photoresist pattern. In other words, shapes of exposure patterns formed on the main photo mask 50 may be transferred to the photoresist layer to form a photoresist pattern.

Hereinabove, the transmissive photo mask including the main photo mask and the auxiliary photo mask has been described. Hereinafter, a reflective photo mask will be described.

Hereinafter, exposure equipment in accordance with another example embodiment of the present invention will be described.

Figure 6:
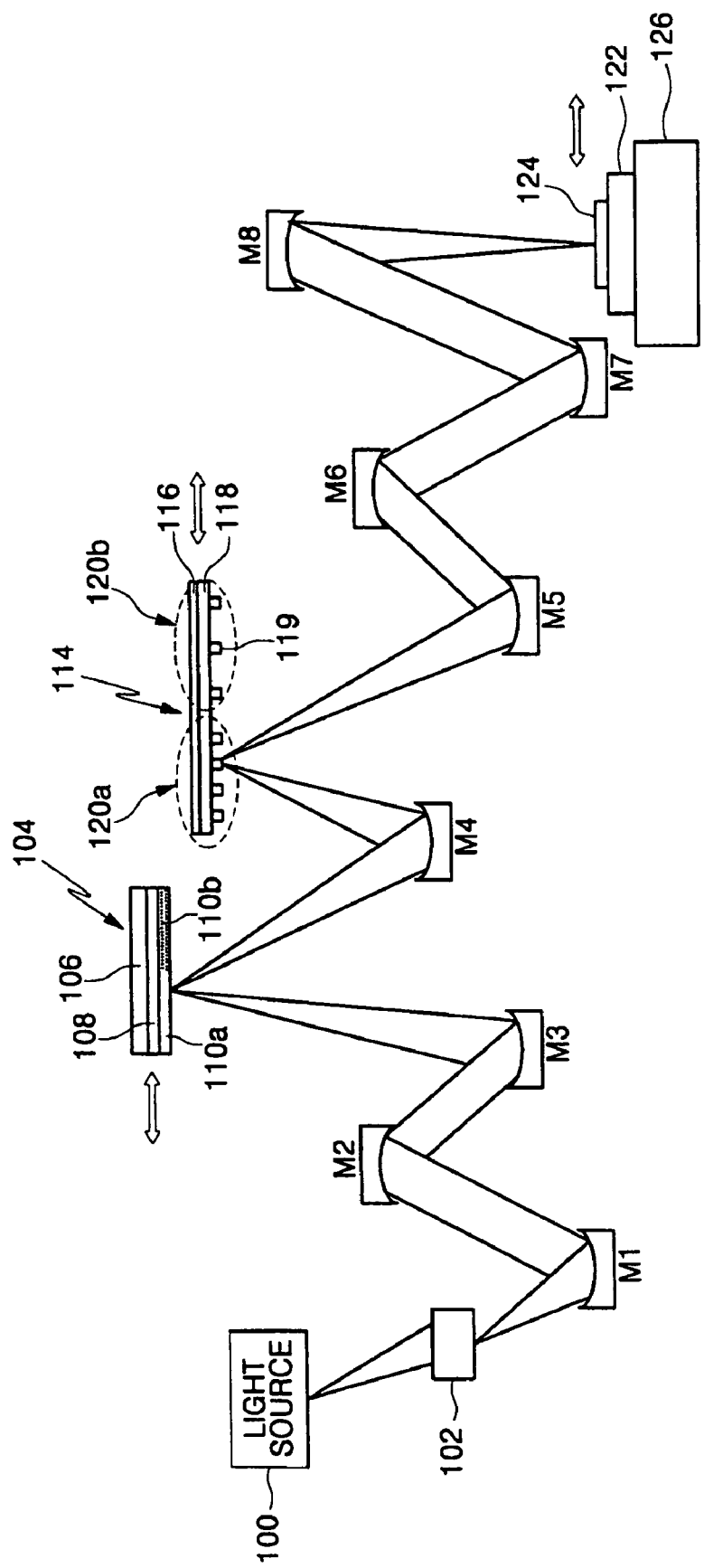
FIG. 6 is a schematic diagram of exposure equipment in accordance with yet another example embodiment of the present invention.

Referring to FIG. 6, exposure equipment in accordance with another example embodiment of the present invention may include a light source 100, and an optical system 102 spaced apart from the light source 100 by a desired distance. The light source 100 may be extreme ultraviolet (EUV). The EUV is an electromagnetic wave having a short wavelength of 3 nm to 50 nm. In order to improve resolution, the light source 100 having a short wavelength, for example, the EUV may be employed as a light source of an exposure process of a high integrated circuit pattern having a design rule of 0.25 µm or less. The light source 100 having a small wavelength, for example, the EUV has very high light absorptivity. Because it may be difficult to use the EUV as a light source to the exposure process employing the transmissive photo mask having very high light absorptivity, the exposure equipment using the EUV may employ a reflective photo mask.

The optical system 102 may include various kinds of optical lenses and a spectral purity filter (not shown). Therefore, the light irradiated from the light source 100 may enter the optical system 102 to pass through the optical lenses and the spectral purity filter.

An auxiliary photo mask 104 may be spaced apart from the optical system 102 by a desired distance. In example embodiments, the light source 100 and the auxiliary photo mask 104 may be in a conjugate relation with each other.

A plurality of reflective mirrors M1, M2 and M3 may be disposed between the optical system 102 and the auxiliary photo mask 104. Therefore, the light passing through the optical system 102 may be sequentially reflected from the reflective mirrors M1, M2 and M3 to enter the auxiliary photo mask 104.

The auxiliary photo mask 104 may include a transparent substrate 106, and a reflective layer 108 disposed on the transparent substrate 106. The auxiliary photo mask 104 may further include a transparent region 110a and a translucent region 110b adjacent to each other and disposed on the reflective layer 108. Therefore, the light entering the auxiliary photo mask 104 may pass through the transparent region 110a or the translucent region 110b to arrive at the reflective layer 108. The light arrived at the reflective layer 108 may be reflected by the reflective layer 108 to pass through the transparent region 110a or the translucent region 110b.

The transparent region 110a and the translucent region 110b may have different light transmissivities. Therefore, intensity of the light passing through the transparent region 110a may be different from that of the light passing through the translucent region 110b. For example, the intensity of the light passing through the transparent Ia region 110a may be greater than that of the light passing through the translucent region 110b.

The transparent substrate 106 may be formed of silicon. The reflective layer 108 may be a multi-layered structure having a molybdenum layer and a silicon layer alternately and repeatedly deposited thereon, or a molybdenum layer and a beryllium layer alternately and repeatedly deposited thereon.

The transparent region 110a may be formed of transparent quartz. The translucent region 110b may be formed of molybdenum silicide. If the translucent region 110b is a molybdenum silicide layer, the thickness of the molybdenum silicide layer may be varied to adjust transmission amount of the light passing through the translucent region 110b.

In addition, the translucent region 110b may be a phase shift layer. That is, the translucent region 110b may be a molybdenum silicide layer, and chrome patterns disposed on the molybdenum silicide layer. In example embodiments, the chrome patterns may function as an opaque region. While the phase shift region may be designed to have a transmissivity of about 8% and a phase shift of 180°, example embodiments of the present invention are not limited thereto. For example, the thickness of the molybdenum silicide layer and an interval between the chrome patterns may be varied to design the phase shift region to adjust transmissivity and phase shift of the light passing through the phase shift region.

In addition, the translucent region 110b may be a crystal defect. For example, a crystal defect may be provided in a quartz substrate using a laser. Therefore, the light entering the quartz substrate having the crystal defect may be scattered by the crystal defect to adjust transmissivity. In addition, a crystal defect may be provided in a molybdenum silicide. Alternatively, impurities may be doped in the quartz substrate to provide the translucent region 110b. Alternatively, the translucent region 110b may be formed by depositing chrome on the quartz substrate. Further alternatively, a light absorbing coating layer, for example, an opaque paint may be formed on the translucent region 110b.

While the auxiliary photo mask 104 may include only the transparent region 110a and the translucent region 110b, the auxiliary photo mask in accordance with example embodiments of present invention is not limited thereto. For example, the translucent region 110b may include a plurality of sequentially deposited layers having different transparencies.

A main photo mask 114 may be spaced apart from the auxiliary photo mask 104 by a desired distance. The auxiliary photo mask 104 and the main photo mask 114 may be in a conjugate relation with each other.

The auxiliary photo mask 104 and the main photo mask 114 may be movably aligned to have a conjugate relation with each other.

In addition, in the case of a scan type exposure equipment, in order to improve synchronization margin for aligning the auxiliary photo mask 104 and the main photo mask 114, the auxiliary photo mask 104 may be manufactured or disposed to have a lager size in comparison with the main photo mask 114.

The auxiliary photo mask 104 and the main photo mask 114 may be disposed opposite to each other. In example embodiments, the auxiliary photo mask 104 may be disposed on a path of the light reflected from the main photo mask 114. That is, the auxiliary photo mask 104 may disturb progression of the light reflected from the main photo mask 114. In order to prevent the disturbance, the auxiliary photo mask 104 may be spaced far apart from the main photo mask 114. However, when the auxiliary photo mask 104 is spaced too far apart from the main photo mask 114, it may be difficult to adjust transmissivity of an exposure process due to light dispersion or diffraction of the light entering the main photo mask 114 from the auxiliary photo mask 104.

In order to solve the problems disclosed above, a reflective mirror M4 may be disposed between the auxiliary photo mask 104 and the main photo mask 114. Therefore, the light passing through the auxiliary photo mask 104 may be reflected from the reflective mirror M4 and then enter the main photo mask 114. As a result, because the auxiliary photo mask 104 and the main photo mask 114 are disposed in the same direction with respect to the reflective mirror M4, it may be possible to prevent the auxiliary photo mask 104 from being disposed on a path of the light reflected from the main photo mask 114.

In addition, the reflective mirror M4 may be used such that the auxiliary photo mask 104 and the main photo mask 114 may be in a conjugate relation with each other. Further, the auxiliary photo mask 104, the main photo mask 114, and the reflective mirror M4 may be in a conjugate relation with each other.

Alternatively, when the auxiliary photo mask 104 and the main photo mask 114 are disposed opposite to each other and the reflective mirror M4 is not disposed therebetween, reflective mirrors M3 and M5 having appropriate focal lengths may be disposed at both sides of the auxiliary photo mask 104 and the main photo mask 114 to solve the problems.

The main photo mask 114 may include a transparent substrate 116, and a reflective mirror 118 disposed on the transparent substrate 116. The transparent substrate 116 may be formed of silicon. The reflective layer 118 may be a multi-layered structure having a molybdenum layer and a silicon layer alternately and repeatedly deposited thereon or a molybdenum layer and a beryllium layer alternately and repeatedly deposited thereon. The main photo mask 114 may include an exposure pattern. For example, light absorbing layer patterns 119 may be formed on the reflective layer 118. The light absorbing layer patterns 119 may be formed of light absorbing coating layer patterns, for example, opaque paint. Therefore, the light entering the main photo mask 114 may be absorbed by the light absorbing layer patterns or reflected by the reflective layer 118.

The light absorbing layer patterns 119 may be divided into a high-density light absorbing layer pattern region 120a and a low-density light absorbing layer pattern region 120b. When the light absorbing layer patterns have the same width, an interval between the light absorbing layer patterns in the high-density light absorbing layer pattern region 120a may be relatively smaller than that of the light absorbing layer patterns in the low-density light absorbing layer pattern region 120b. In other words, intervals of the exposure patterns may not be uniform. Therefore, intensity of the light reflected from the high-density light absorbing layer pattern region 120a may be different from that of the light reflected from the low-density light absorbing layer pattern region 120b. For example, the intensity of the light reflected from the high-density light absorbing layer pattern region 120a may be relatively smaller than that of the light reflected from the low-density light absorbing layer pattern region 120b. In other words, reflectivity of the light reflected from the main photo mask 114 may be different according to alignment density of the light absorbing layer patterns.

In order to uniformly adjust reflectivity of the light reflected from the main photo mask 114, the transparent region 110a of the auxiliary photo mask 104 may be disposed corresponding to the high-density light absorbing layer pattern region 120a of the main photo mask 114. Similarly, the translucent region 110b of the auxiliary photo mask 104 may be disposed corresponding to the low-density light absorbing layer pattern region 120b of the main photo mask 114. As a result, after reflecting from the auxiliary photo mask 104 to enter the main photo mask 114, reflectivity of the light reflected from the main photo mask 114 may be uniform.

Alternatively, in order to optimize uniformity of the light reflected from the main photo mask 114, the transparent region 110a and the translucent region 110b may be formed on the main photo mask 114, without the auxiliary photo mask 104.

Meanwhile, the auxiliary photo mask 104 and the main photo mask 114 may be movably disposed. Therefore, in order to optimize uniformity of reflectivity of the light reflected from the main photo mask 114, the auxiliary photo mask 104 or the main photo mask 114 may be movable.

A wafer chuck 122 may be spaced apart from the main photo mask 114 by a desired distance. A wafer 124 may be disposed on the wafer chuck 122. The wafer 124 may be in a conjugate relation with the main photo mask 114. As a result, the auxiliary photo mask 104, the main photo mask 114, and the wafer 124 may be in a conjugate relation with each other. The wafer chuck 122 may be disposed on a wafer stage 126. The wafer stage 126 may be movably disposed in a vertical or horizontal direction. Therefore, by moving the wafer stage 126, the wafer 124 may be loaded to have a conjugate relation with the main photo mask 114.

A plurality of reflective mirrors M5, M6, M7 and M8 may be disposed between the main photo mask 114 and the wafer chuck 122. Therefore, the light reflected from the main photo mask 114 may be reflected from the reflective mirrors M5, M6, M7 and M8 to enter the wafer chuck 122.

While the auxiliary photo mask 104 may be disposed between the light source 100 and the main photo mask 114, the position of the auxiliary photo mask 104 and the main photo mask 114 may be switched.

While the auxiliary photo mask 104 may be disposed corresponding to density of the light absorbing layer pattern of the main photo mask 114, the auxiliary photo mask 104 may be disposed corresponding to manufacturing tolerance of an exposure pattern of the main photo mask 114. For example, a translucent region 110b of the auxiliary photo mask 104 may be disposed corresponding to an exposure pattern of the main photo mask having manufacturing tolerance.

The auxiliary photo mask 104 is in a conjugate relation with the main photo mask 114 and corresponds to a CD variation of the exposure pattern of the main photo mask 114, thereby improving uniformity of light transmissivity.

As described above, example embodiments may disclose two or more elements in a conjugate relation. In example embodiments, in a conjugate relation may be defined as follows. If light travels from a source S to an image point P through an optical system and the light paths are reversible, the point S and P may be referred to as conjugate points or as being in a conjugate relation.

While example embodiments of the present invention have been described in connection with what is presently considered to be the most practical and example embodiments, it is to be understood that example embodiments of the present invention may not limited to the disclosed embodiments, but on the contrary, it is intended to cover various modification within the scope of the Invention, which is set forth in the appended claims.

What is claimed is:

1. Exposure equipment, comprising:
   a light source configured to produce light;
   a first photo mask having a first pattern region and a second pattern region, the first photo mask spaced apart from the light source by a desired distance associated with the first photo mask, the first photo mask configured to receive the light from the light source and irradiate the light;
   a second photo mask having a first region and a second region, the second photo mask spaced apart from the light source by a desired distance associated with the second photo mask; and
   a first reflective mirror disposed on an optical path between the first photo mask and the second photo mask, the first reflective mirror configured to receive all the light irradiated from the first photo mask and irradiate all the light to the second photo mask;
   wherein the first photo mask includes a first reflective layer,
   wherein the first and second pattern regions of the first photo mask are formed on the first reflective layer,
   wherein the first pattern region of the first photo mask includes a high-density light absorbing pattern region,
   wherein the second pattern region of the first photo mask includes a low-density light absorbing pattern region,
   wherein the second photo mask includes a second reflective layer,
   wherein the first and second regions of the second photo mask are formed adjacent to each other on the second reflective layer,
   wherein the first region of the second photo mask includes a transparent region that corresponds to the high-density light absorbing pattern region, and
   wherein the second region of the second photo mask includes a translucent region that corresponds to the low-density light absorbing pattern region.

2. The exposure equipment according to claim 1, wherein the first photo mask is disposed between the light source and the second photo mask.

3. The exposure equipment according to claim 1, wherein the first photo mask and the second photo mask are in optically conjugate relation with each other.

4. The exposure equipment according to claim 1, wherein the first and second pattern regions of the first photo mask are disposed corresponding to the first and second regions of the second photo mask.

5. The exposure equipment according to claim 4, wherein the first pattern region of the first photo mask corresponds to the first region of the second photo mask, and
   wherein the second pattern region of the first photo mask corresponds to the second region of the second photo mask.

6. The exposure equipment according to claim 1, wherein the translucent region of the second photo mask includes at least one material selected from a crystal defect material and a phase shift material.

7. The exposure equipment according to claim 1, wherein the second photo mask includes a transparent substrate.

8. The exposure equipment according to claim 1, further comprising:
   a condenser lens disposed between the second photo mask and the first photo mask.

9. The exposure equipment according to claim 1, further comprising:
   at least one second reflective mirror disposed between the light source and the second photo mask.

10. The exposure equipment according to claim 1, further comprising:
    at least one third reflective mirror disposed between the first photo mask and a target of the exposure equipment.

11. The exposure equipment according to claim 1, wherein the first reflective layer includes a multi-layered structure.

12. The exposure equipment according to claim 11, wherein the multi-layered structure includes molybdenum layers and silicon layers, or
    wherein the multi-layered structure includes molybdenum layers and beryllium layers.

13. The exposure equipment according to claim 1, wherein the second reflective layer includes a multi-layered structure.

14. The exposure equipment according to claim 13, wherein the multi-layered structure includes molybdenum layers and silicon layers, or
    wherein the multi-layered structure includes molybdenum layers and beryllium layers.

15. A method, comprising:
    providing light from a light source;
    irradiating the light from the light source to a second photo mask having a first region and a second region;
    irradiating the light from the second photo mask to a first reflective mirror; and irradiating the light from the first reflective mirror to a first photo mask having a first pattern region and a second pattern region;

wherein the light irradiated from the second photo mask to the first photo mask enters a first reflective layer on the first photo mask, wherein the light irradiated from the light source to the second photo mask enters a second reflective layer on the second photo mask, wherein the first reflective mirror is disposed on an optical path between the first and second photo masks, and wherein the first reflective mirror reflects all of the light passing between the first and second photo masks.

16. The method according to claim 15, wherein the light irradiated from the light source to the second photo mask enters the first pattern region of the first photo mask through the first region of the second photo mask, and wherein the light irradiated from the light source to the second photo mask enters the second pattern region of the first photo mask through the second region of the second photo mask.

17. The method according to claim 15, wherein the light irradiated from the second photo mask to the first photo mask enters the first pattern region of the first photo mask through the first region of the second photo mask, and wherein the light irradiated from the second photo mask to the first photo mask the second pattern region of the first photo mask through the second region of the second photo mask.

18. The method according to claim 15, wherein the first photo mask and the second photo mask are in optically conjugate relation with each other.

19. The method according to claim 15, further comprising: irradiating the light through a reflective mirror between the second photo mask and the first photo mask.

* * * * *